United States Patent [19]
Okazaki et al.

[11] Patent Number: 5,157,398
[45] Date of Patent: Oct. 20, 1992

[54] A/D CONVERTOR OF THE PIPELINE TYPE HAVING ADDITIONAL COMPARATORS FOR USE IN SETTING A SPECIFIED REFERENCE VOLTAGE

[75] Inventors: Takao Okazaki, Ohme; Kazuo Yamakido, Tokyo, both of Japan

[73] Assignee: Hitachi, Ltd., Tokyo, Japan

[21] Appl. No.: 778,246

[22] Filed: Oct. 17, 1991

[30] Foreign Application Priority Data

Oct. 17, 1990 [JP] Japan ................ 2-278052

[51] Int. Cl.[5] ............................................ H03M 1/38
[52] U.S. Cl. ........................................ 341/161; 341/155
[58] Field of Search ................. 341/161, 159, 158, 155

[56] References Cited

U.S. PATENT DOCUMENTS 4,994,808 2/1991 Wichelman ...................... 341/161

*Primary Examiner*—Sharon D. Logan
*Attorney, Agent, or Firm*—Antonelli, Terry, Stout & Kraus

[57] ABSTRACT

In an A/D convertor, one comparator is provided for the most significant bit of the output digital signal, two for the second bit, and three each for the third and lower-order bits. When a compare operation is being performed by one of the three comparators that are provided for each of the third and lower bits, the remaining two comparators provide outputs in response to which output switch circuits perform setting of two reference voltages that are specified by the comparison result of a comparator corresponding to an output digital signal two bits higher.

10 Claims, 8 Drawing Sheets

FIG. 3

A/D CONVERTOR OF THE PIPELINE TYPE HAVING ADDITIONAL COMPARATORS FOR USE IN SETTING A SPECIFIED REFERENCE VOLTAGE

BACKGROUND OF THE INVENTION

1. Field of the Invention

The present invention relates to an analog/digital (A/D) convertor and more particularly to an A/D convertor used in an video coder-decoder (CODEC) for the Integrated Services Digital Network (ISDN).

2. Background Art

There is an A/D convertor that converts an input analog signal such as video signal into an output digital signal made up of a specified number of bits. Also available are a video CODEC incorporating the A/D convertor and a wide-band ISDN that includes the video CODEC.

The wide-band ISDN requires an A/D convertor that rapidly converts video signals of wide frequency band into output digital signals of relatively few bits. Among the A/D convertors that meet this requirement is a so-called total parallel comparison type A/D convertor that instantly compares all the sampled input analog signals with all reference voltages. This type, however, requires 255 comparators (voltage comparison circuits), a significant amount of hardware, only to obtain 8-bit output digital signals.

To cope with this situation, what is generally called a pipeline type A/D convertor is proposed, which has comparators assigned one for each bit of the output digital signal and performs a pipeline processing in which the reference voltages given to the comparators are selected according to the comparison results of comparators for higher-order bits.

The pipeline type A/D convertor is introduced in the collection of IEEE papers 1987 "Custom Integrated Circuits Conference," page 694–697.

The inventors of this invention has found that the pipeline type A/D convertor mentioned above has the following drawbacks. Although the compare operation of each comparator and the precharging of the reference voltages can be completed in a relatively short period of time, the precharging of the reference voltages is performed only after the comparators for the high-order bits have produced comparison results and then the compare operation is initiated when the precharging operation is finished. In other words, the time taken by the precharging operation and the compare operation depends on the settling time of each sample-and-hold circuit, and determines the sampling speed of the A/D convertor. This puts constraints on high-speed operation of the A/D convertor, which in turn degrades the overall performance of the video CODEC incorporating the A/D convertor and also of the wide-band ISDN.

SUMMARY OF THE INVENTION

An object of this invention is to provide an A/D convertor of pipeline type capable of high-speed operations.

Another object of the invention is to enhance the high-speed performance of the video CODEC with a built-in A/D convertor and also enhance the performance of the wide-band ISDN including the video CODEC.

These and other objects and novel features of this invention will become apparent from the description of this specification and the accompanying drawings.

A representative embodiment of the invention disclosed in this application is outlined below. In an A/D convertor incorporated in a wide-band ISDN video CODEC, one comparator is provided for the most significant bit of the output digital signal, two comparators for the second most significant bit and three each for the third and lower-order bits. When a compare operation is being performed by one of the three comparators, which are provided for each of the third and lower-order bits, the remaining two comparators simultaneously set the reference voltages for compare operations according to the comparison result of a comparator that corresponds to an output digital signal two bits higher. Various components of the A/D convertor are formed essentially of CMOS or bipolar CMOS circuits.

With the above means, it is possible to minimize an increase in the amount of hardware in the A/D convertor and therefore the required layout area and power consumption and also reduce the sampling period close to the comparator's compare operation time or the precharging time. As a result, the video CODEC incorporating the A/D convertor can achieve the reduced cost and power consumption while at the same time enhancing the high-speed performance, which in turn upgrades the capability of the wide-band ISDN including the video CODEC.

BRIEF DESCRIPTION OF THE DRAWINGS

FIG. 3 is a timing chart showing one example operation timings of the A/D convertor of FIG. 1;

DESCRIPTION OF THE PREFERRED EMBODIMENTS

Figure 1:
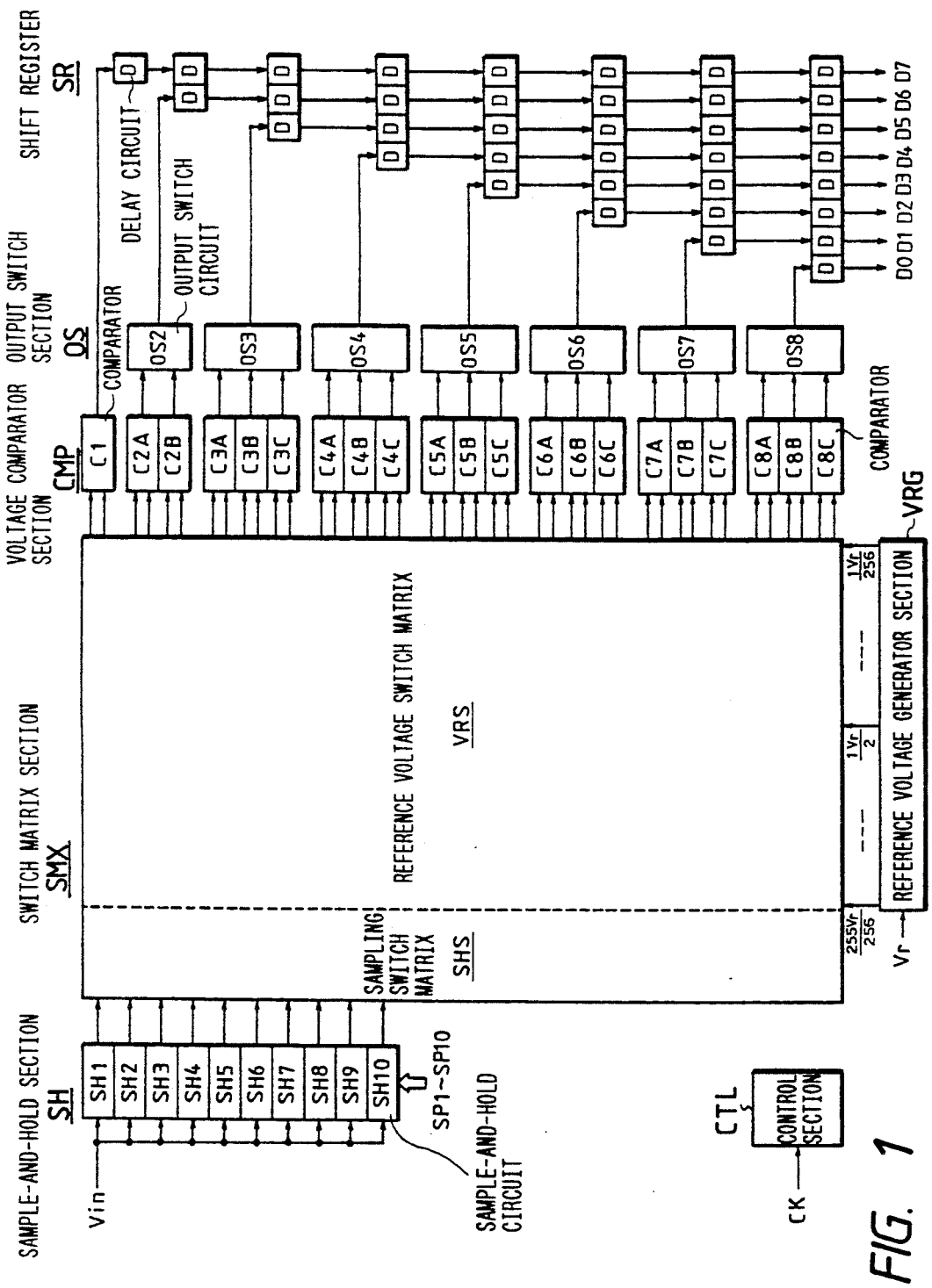
FIG. 1 is a block diagram showing one embodiment of an A/D convertor according to this invention.
Figure 2:
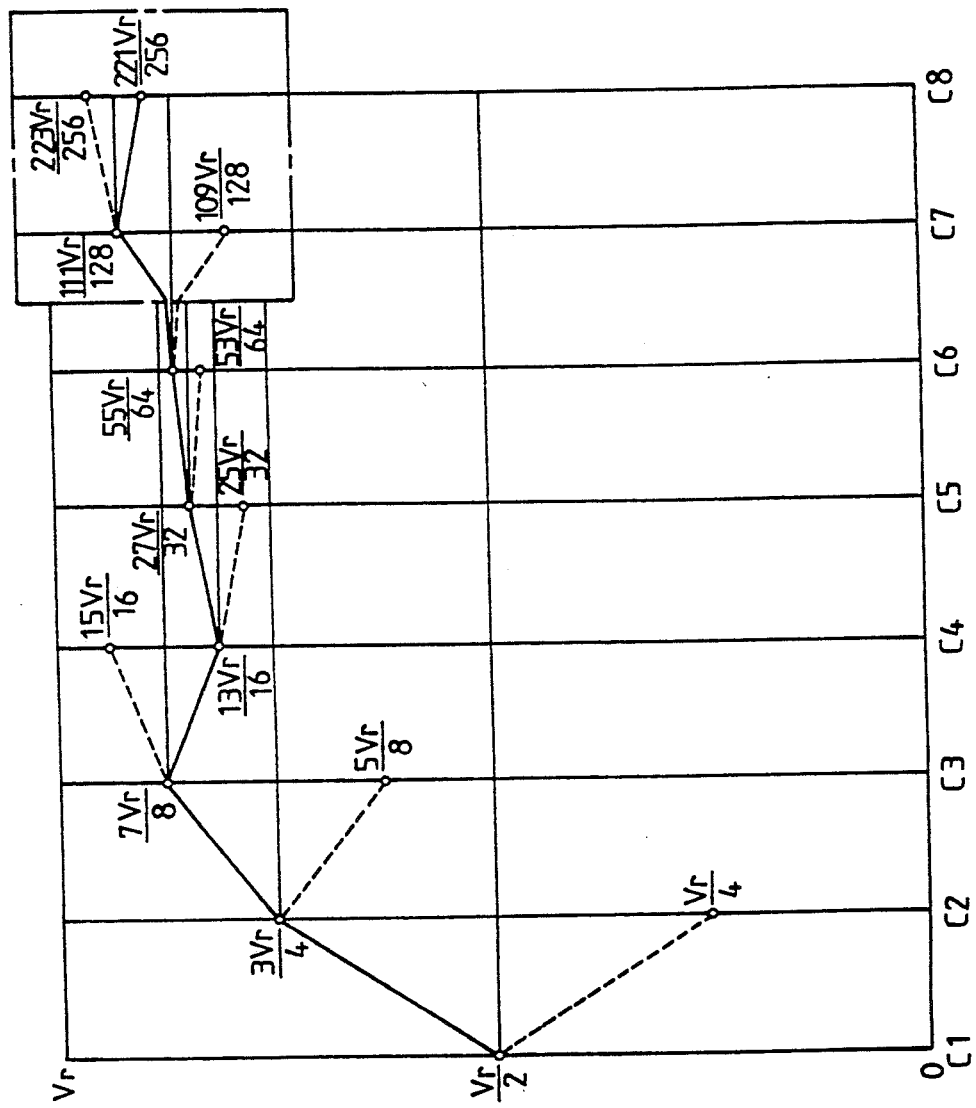
FIG. 2 is a process flow diagram showing one example processing as performed by the A/D convertor of FIG. 1.
Figure 3:
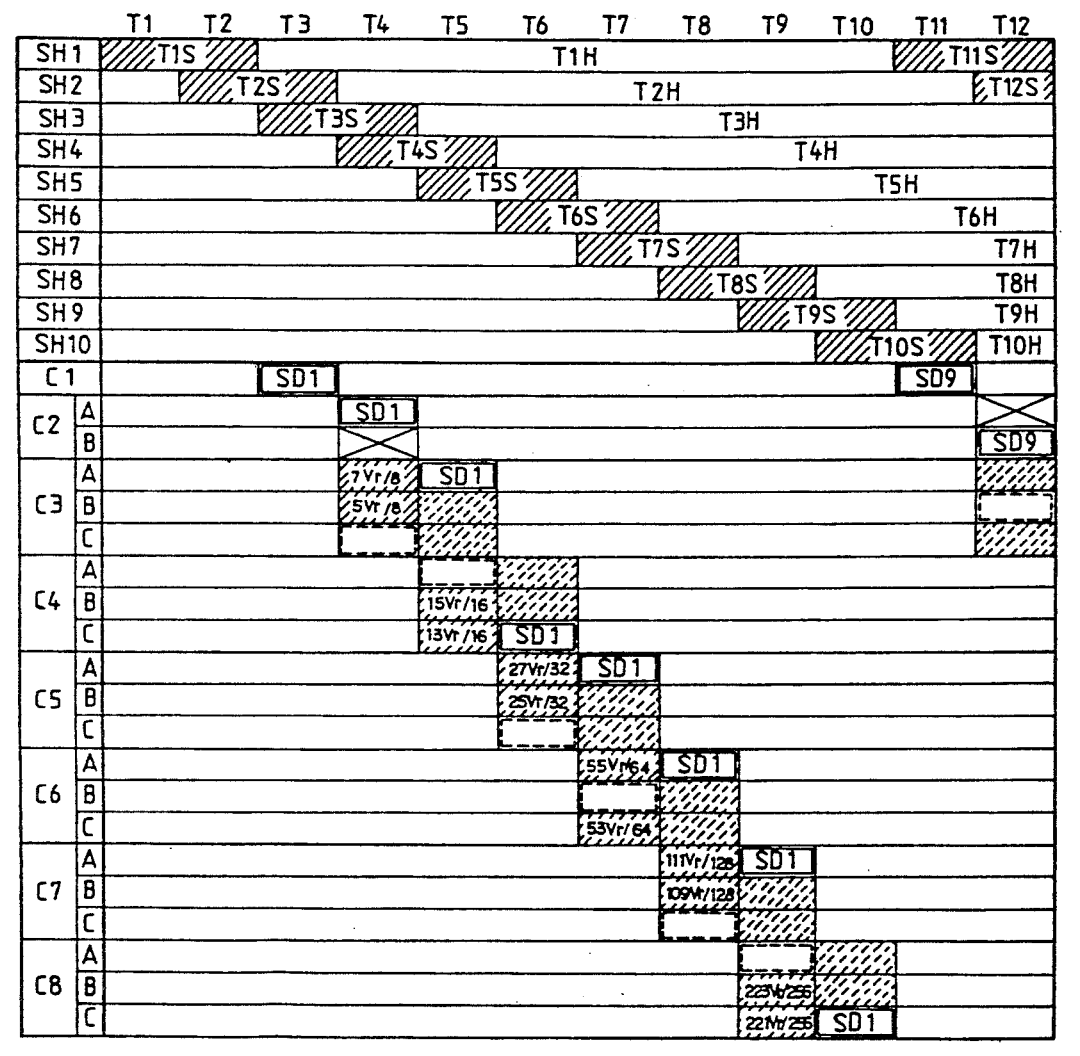

FIG. 1 shows a block diagram of the A/D convertor as one embodiment of this invention. FIG. 2 shows one example flow of processing as performed by the A/D convertor of FIG. 1. FIG. 3 shows one example operation timing of the A/D convertor. FIGS. 4, 6, 7 and 8 show circuit diagrams of a sample-and-hold section, a reference voltage generator section, a switch matrix section, and a voltage comparator section and an output switch section in the A/D convertor, respectively. Further, FIG. 5 shows a circuit diagram of one embodiment of an operational amplifier circuit included in the sample-and-hold section of FIG. 4. FIG. 9 shows a circuit diagram of one embodiment of a comparator included in the voltage comparator section of FIG. 6. Referring to these drawings, the configuration and operation as well as features of the A/D convertor shown in these drawings as one embodiment of the invention will be described.

The A/D convertor of this embodiment is incorporated in the wide-band ISDN video CODEC and has a function to convert at high speeds video signals of relatively wide frequency band, i.e., input analog signals $V_{in}$ into output digital signals $D_7$–$D_0$. The circuit elements shown in FIGS. 4 through 9 and those circuit elements making up the blocks of FIG. 1, along with other circuit elements making up the video CODEC, are formed on a single semiconductor substrate such as a monocrystal silicon. In the following circuit diagrams, a MOSFET (metal oxide semiconductor field-effect transistor; MOSFET in this specification generally represents insulated-gate field-effect transistors) is marked with an arrow, if it is a p-channel type, to distinguish itself from an n-channel MOSFET with no arrow marking.

In FIG. 1, the A/D convertor has a sample-and-hold section SH made up of 10 sample-and-hold circuits SH1–SH10. These sample hold circuits receive at their input terminals analog signals $V_{in}$ from the preceding stage of circuit in the video CODEC not shown. The output signals SD1–SD10 are supplied to corresponding input terminals of sampling switch matrix SHS of the switch matrix section SMX. The sample-and-hold circuits SH1–SH10 also receive at their control terminals sampling control signals SP1–SP10.

Figure 4:
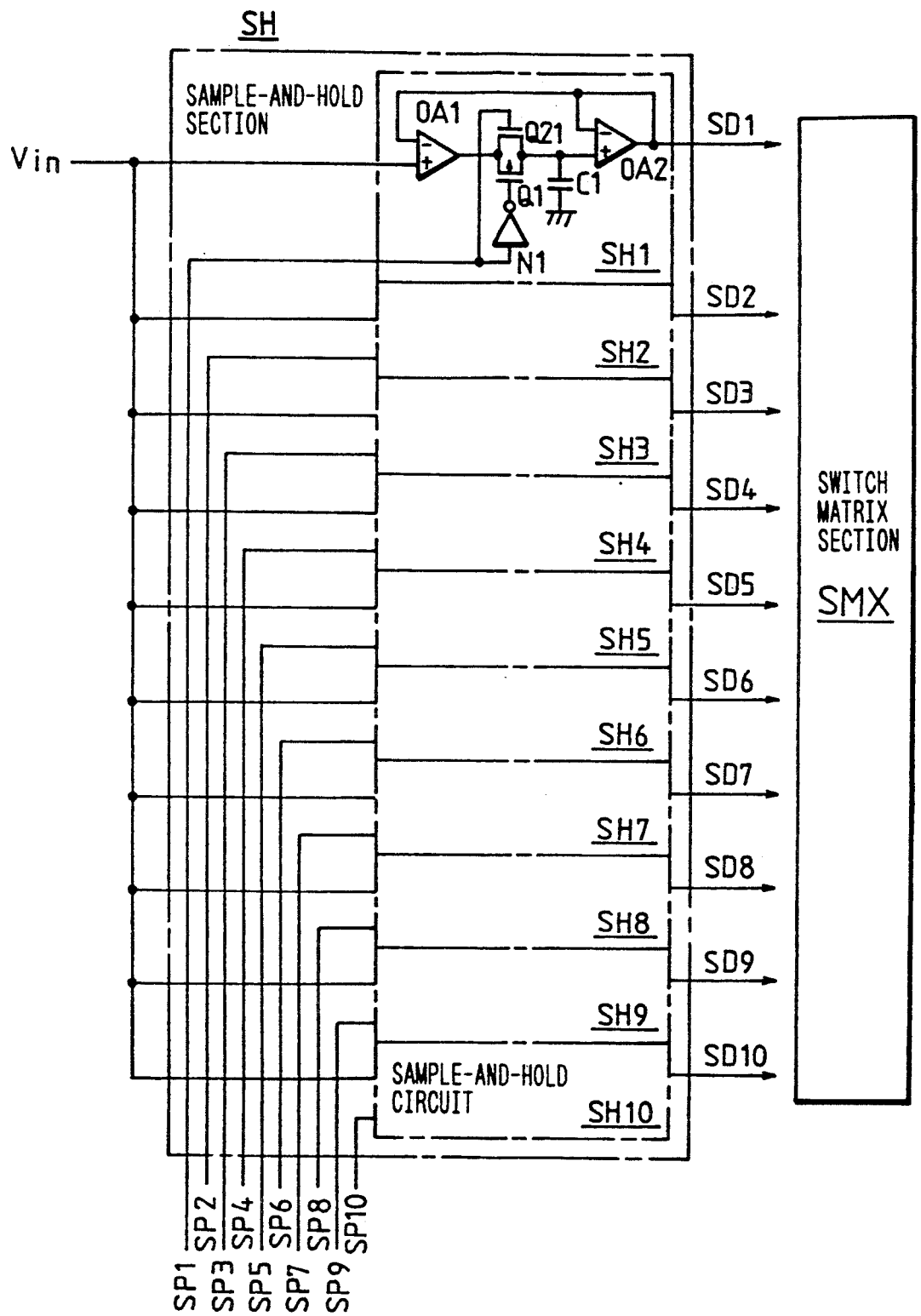
FIG. 4 is a circuitry showing one embodiment of a sample hold section of the A/D convertor of FIG. 1.
Figure 5:
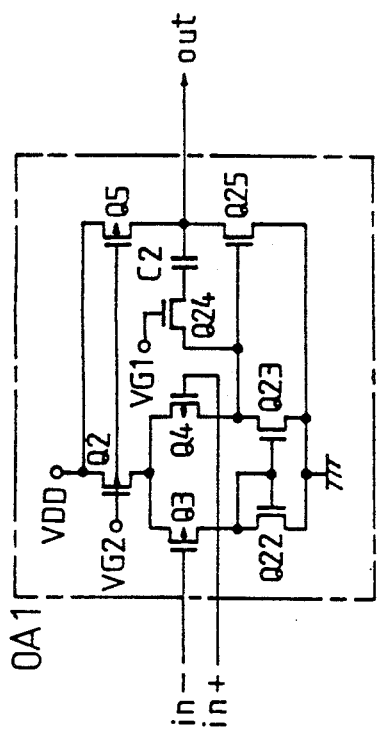
FIG. 5 is a circuitry showing one embodiment of an operational amplifier included in the sample hold section of FIG. 4.

The sample-and-hold circuits SH1–SH10 making up the sample-and-hold section SH each include two operational amplifiers OA1 and OA2, as representatively shown by the sample-and-hold circuit SH1 in FIG. 4. Of these, the operational amplifier OA1 receives the analog signal $V_{in}$ at its non-inverting (+) input terminal. The inverting (−) input terminal is connected to the inverting (−) input terminal of the operational amplifier OA2 and further to the output terminal of the operational amplifier OA2, i.e., the output terminal SD1 of the sample-and-hold circuit. With this connection, the operational amplifiers OA1 and OA2 function as a signal transfer circuit whose input impedance is nearly infinite and its amplification is almost unity.

The output terminal of the operational amplifier OA1 is connected to a sample-and-hold capacitor C1 through an analog switch made up of p-channel MOSFETs Q1 and n-channel MOSFET Q21, and further connected to the non-inverting (+) input terminal of the operational amplifier OA2. The MOSFET Q21 receives at its gate a corresponding sampling control signal SP1, and the MOSFET Q1 is receives at its gate an inverted sampling control signal from an invertor N1. Thus, the analog switch formed by the MOSFETs Q1 and Q21 is selectively turned on when the corresponding sampling control signal SP1 goes high, transferring the output signal of the operational amplifier OA1, i.e., the level of the input analog signal $V_{in}$, to the sample-and-hold capacitor C1. The sampled voltage held by the capacitor C1 is sent through the operational amplifier OA2 to the corresponding input terminal of the sampling switch matrix SHS of the switch matrix section SMX as an output signal SD1 of the sample-and-hold circuit.

In this embodiment, the settling time of the sample-and-hold circuits SH1–SH10 or the time taken by the input analog signal $V_{in}$ level to be charged to and held by the sample-and-hold capacitor C1 is set equal to the time it takes for the comparator to perform the pre-charge and compare operations (described later), in other words it is set to about two times the fundamental clock period of the A/D convertor or two times the single time slot. Hence, the sampling control signals SP1–SP10 are shifted one time slot at the leading edge, and their pulse widths and periods are two and 10 time slots long, respectively. As a result, the sample-and-hold circuits SH1–SH10 perform the sampling operation as shown shaded in FIG. 3, and then keep the sampled voltage until the sampling control signal becomes high the next time.

The operational amplifiers OA1 and OA2 making up each sample-and-hold circuit of the sample-and-hold section SH are formed basically of CMOS (complementary MOS) circuits, as shown represented by the operational amplifier OA1 of FIG. 5, to reduce the power consumption and enhance the circuit density. That is, the operational amplifiers OA1 and OA2 include a pair of opposite or differentially arranged p-channel MOSFETs Q3 and Q4. These MOSFETs Q3 and Q4 have their drains connected through n-channel MOSFETs Q22 and Q23 to the earth potential of the circuit and their common source connected through a p-channel MOSFET Q2 to a supply voltage VDD. The MOSFET Q2 functions as a constant current source that, when given a specified constant voltage VG2 at its gate, will apply a predetermined operating current to the differential MOSFETs Q3 and Q4.

In each operational amplifier, the gate of the MOSFET Q3 serves as the inverting (−) input terminal, and the gate of the MOSFET Q4 serves as the non-inverting (+) input terminal. The gate of the MOSFET Q22 is connected to its drain and also to the gate of the MOSFET Q23. Therefore, the MOSFETs Q22 and Q23 work as an active load of current mirror type for the differential MOSFETs Q3 and Q4 and form a differential amplifier together with the differential MOSFETS. The differential amplifier has its inverted output signal, i.e., the drain potential of MOSFET Q4, sent out as an output signal out to each operational amplifier through an inverter circuit made up of p-channel MOSFET Q5 and n-channel MOSFET Q25. Provided between the inverted output node of the differential amplifier and the output terminal of the operational amplifier is a feedback circuit made up of an n-channel MOSFET Q24 and a capacitor C2 to improve the high-frequency characteristic of the operational amplifier.

The A/D convertor of this embodiment further comprises a reference voltage generator section VRG which produces reference voltages $V_r/256$–$255V_r/256$ in 256 steps; a voltage comparator section CMP made up of 21 comparators C1–C8C; and a switch matrix section SMX which selectively transfers to the comparators CL–C8C of the voltage comparator section CMP the sampled voltages SD1–SD10 held by the sample-and-hold section SH and the reference voltages $V_r/1256$–$255V_r/256$ produced by the reference voltage generator section VRG.

Figure 6:
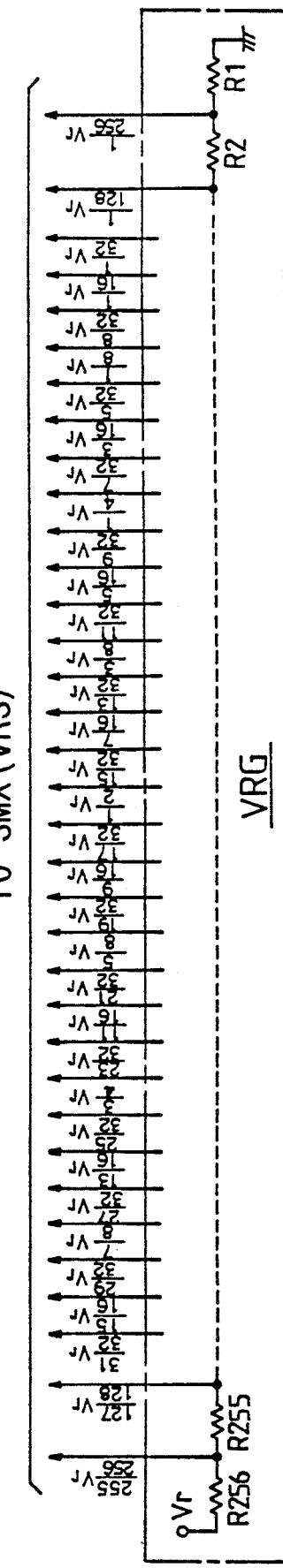
FIG. 6 is a circuitry showing one embodiment of a reference voltage generator section in the A/D convertor of FIG. 1.

The reference voltage generator section VRG includes 256 resistors R1–R256 serially connected between the constant voltage $V_r$ and the circuit earth potential, as shown in FIG. 6. These resistors are designed to have equal resistances with very small variations, and the intermediate node potential between the two adjoining resistors is fed to the reference voltage switch matrix VRS of the switch matrix section SMX as 255-stepped reference voltages $V_r/256$–$255V_r/256$ (also called a comparison voltage).

Figure 7:
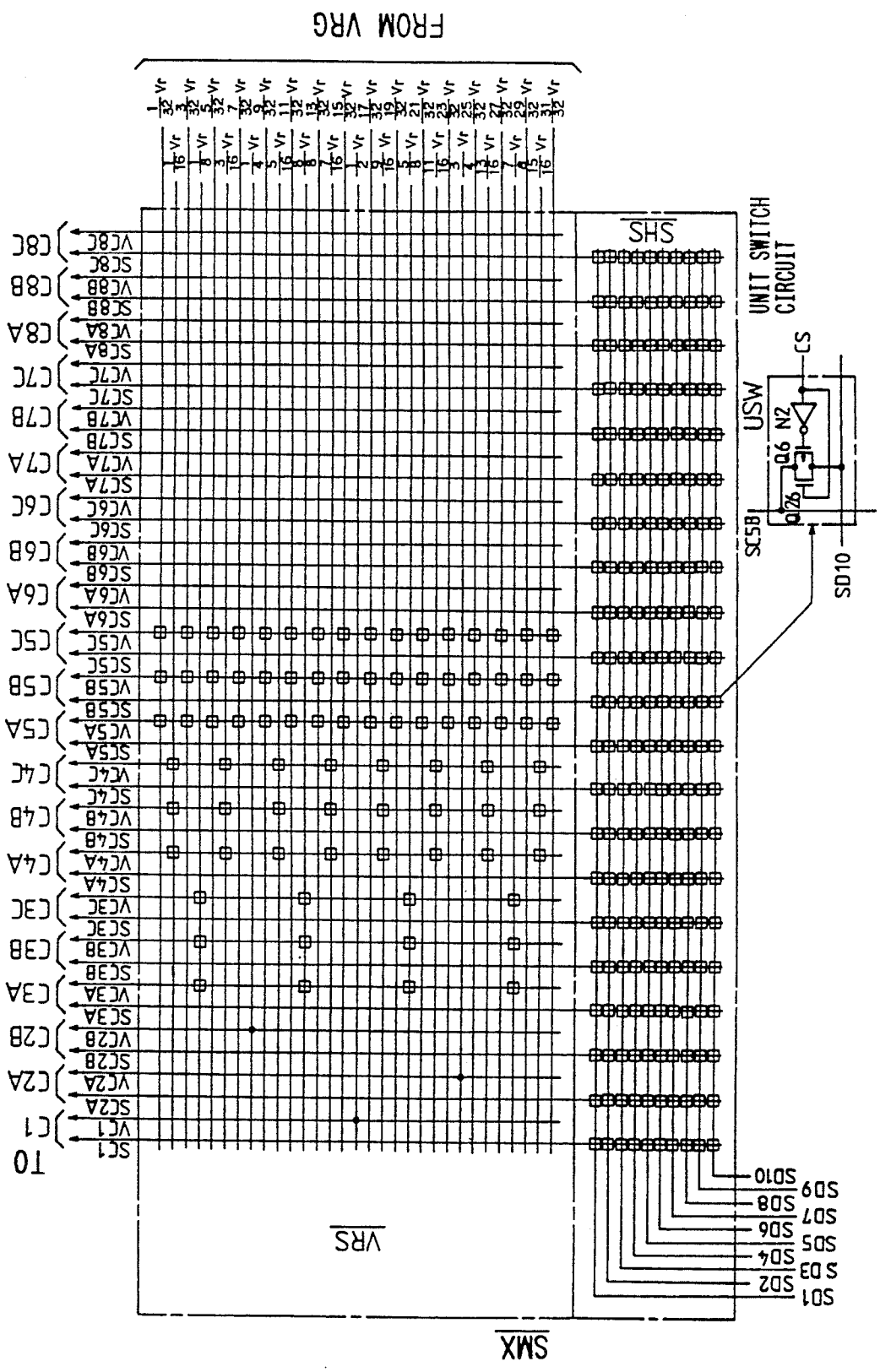
FIG. 7 is a circuitry showing one embodiment of a switch matrix section in the A/D convertor of FIG. 1.

The switch matrix section SMX has a sampling switch matrix SHS and a reference voltage switch matrix VRS, and each switch matrix, as shown in FIG. 7, includes a large number of unit switching circuits USN arranged in matrix. That is, the sampling switch matrix SHS has 210 unit switching circuits USW arranged in matrix at intersections of the output signal lines SD1–SD10 of the sample-and-hold circuits SH1–SH10 of the sample-and-hold section SH and the non-inverted input signal lines SC1–SC8C of the comparators C1–C8C of the voltage comparator section CMP. The reference voltage switch matrix VRS has 756 unit switching circuits USW arranged in matrix in certain combinations between the reference voltages $V_r/256$–$255V_r/256$ and the inverted input signal lines VC3A–VC8C of the comparators C3A–CBC.

There are fixed connections between the reference voltage $V_r/2$ and the inverted input signal VC1 of the comparator C1 and between the reference voltages $V_r/4$ and $3V_r/4$ and the inverted input signal lines VC2A and VC2B of the comparators C2A and C2B. The unit switching circuit USW, as exemplified at the lower right of FIG. 7, is an analog switch made up of a pair of a p-channel MOSFET Q6 and an n-channel MOSFET Q26 provided between the output signal line SD10 and the inverted input signal line SC5B. The unit switching circuit USW is selectively turned on by a selection control signal CS from the control section CTL.

Hence, the sampled voltages SD1–SD10 held by the sample-and-hold circuits SH1–SH10 of the sample-and-hold section SH and the 255-stepped reference voltages $V_r/256$–$255V_r/256$ formed by the reference voltage generator section VRG are selectively transferred to the non-inverting (+) input terminals of the comparators C1–C8C of the voltage comparator section CMP or to the inverting (−) input terminals.

Figure 8:
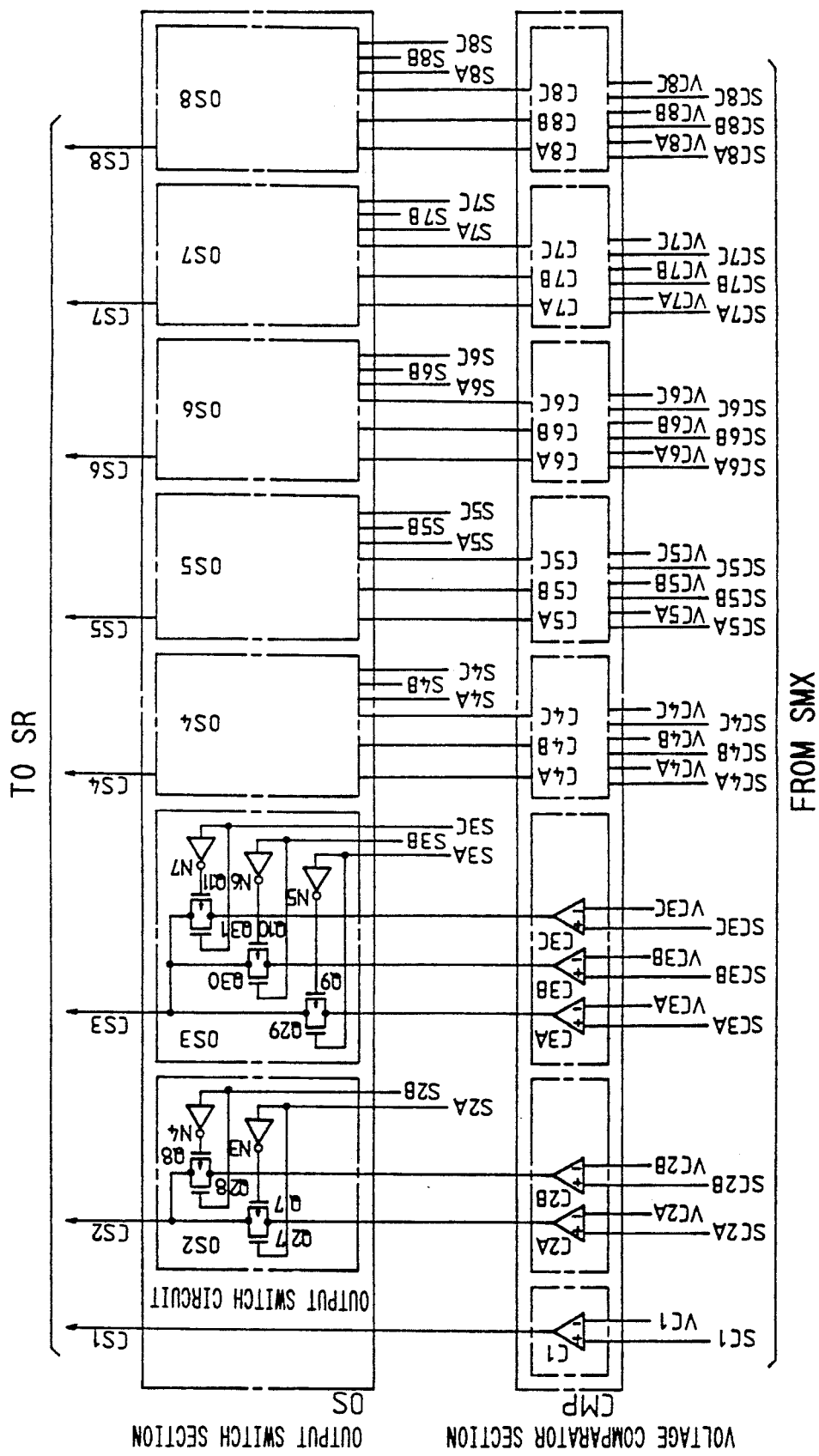
FIG. 8 is a circuitry showing one embodiment of a voltage comparator section and an output switch section in the A/D convertor of FIG. 1.
Figure 9:
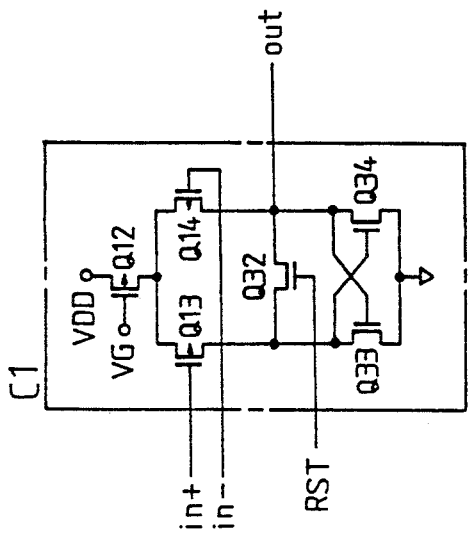
FIG. 9 is a circuitry showing one embodiment of a comparator included in the voltage comparator section of FIG. 8.

The voltage comparator section CMP, as shown in FIG. 8, has one comparator C1 provided for the output digital signal D7 of the most significant bit, two comparators C2A and C2B provided for the output digital signal D6 of the second bit, and three comparators each for the output digital signals D5–D0 of third and lower-order bits or a total of 18 comparators C3A–C3C and C8A–C8C. The non-inverting (+) input terminals of these comparators selectively receive the sampled voltages SD1–SD10 through the sampling switch matrix SHS of the switch matrix section SMX, and the inverting (−) input terminals selectively receive specified reference voltages through the reference voltage switch matrix VRS of the switch matrix section SMX.

In this embodiment, the comparators CL–CBC, as shown exemplified by the comparator C1, are formed basically of CMOS circuits to reduce the power consumption and increase the circuit integration. That is, each comparator includes a pair of differentially arranged p-channel MOSFETs Q13 and Q14. The drains of these MOSFETs Q13 and Q14 are connected through n-channel MOSFETs Q33 and Q34 to the earth potential of the circuit, and their common source is connected through a p-channel MOSFET Q12 to the supply voltage VDD. The MOSETs Q33 and Q34 have their gates and drains cross-connected. The MOSFET Q12 receives a specified constant voltage VG at its gate. Between the drains of the MOSFETs Q13 and Q14 is provided an n-channel MOSFET Q32 that receives a reset signal RST at its gate. Thus, the MOSFETs Q33 and Q34 work as a latch type active load for the MOSFETs Q13 and Q14, and the MOSFET Q32 works as a reset MOSFET.

The output signals out of the comparators C1–C8C are selectively set high when the sampled voltages fed to their non-inverting (+) input terminals are higher than the reference voltages fed to the inverting (−) input terminal.

The output signal of the comparator C1 of the voltage comparator section CMP is transferred as is to the first input terminal of the shift register SR. This output signal is delayed eight time slots by the shift register SR to become the output digital signal D7 of the most significant bit. The output signals of the comparators C2A and C2B are sent to an output switch circuit OS2 of the output switch section OS, which chooses one of the output signals and transfers it to the second input terminal of the shift register SR. This output signal is delayed seven time slots by the shift register SR to become the output digital signal D6 of the second highest bit. Similarly, the output signals of the comparators C3A–C3C to C8A–C8C are selected on a one-out-of-three basis by output switch circuits OS3 to OS8 before being applied to the third to eighth input terminals of the shift register SR. These selected output signals are delayed six to one time slot(s) by the shift register SR to become the output digital signals D5 to D0 of the third to eighth bit.

The output switch circuits OS2–OS8 making up the output switch section OS, as shown exemplified by the output switch circuits OS2 and OS3 in FIG. 8, include two or three sets of analog switch circuits formed of p-channel MOSFETs Q7–Q11 and n-channel MOSFETs Q27–Q31. These analog switch circuits are selectively turned on by the selection control signals S2A–S2B and S3A–S3C from the control section CTL to select one output signal each from the corresponding comparators C2A–C2B and C3A–C3C and send them to the shift register SR.

The output signals of the comparators C1–C8C of the voltage comparator section CMP are also supplied to the control section CTL to selectively form selection control signals for controlling the reference voltage switch matrix VRS of the switch matrix section SMX.

The control section CTL forms various control signals according to a fundamental clock signal CK supplied from the clock generator section in the video CODEC (not shown) and the output signals of the comparators C1–CBC, and then feeds them to the corresponding parts of the A/D convertor.

Next, referring to the process flow diagram of FIG. 2 and the operation time chart of FIG. 3, the conversion processing performed by this A/D convector will be described. These diagrams illustrate an example of conversion processing performed on the sampled voltage SD1 of the input analog signal $V_{in}$ at the time slot T1. It is assumed that the sampled voltage SD1 of the input analog signal $V_{in}$ at the time slot T1 is slightly higher than the reference voltage $221V_r/256$.

In FIG. 3, the level of the input analog signal $V_{in}$ at the time slot T1 is established at the output terminal of the sample-and-hold circuit SH1 of the sample-and-hold section SH for the duration of two time slots. The sampled voltage SD1 held by the sample-and-hold circuit SH1 is, as mentioned earlier, transferred to the non-inverting (+) input terminal of the comparator C1 in the voltage comparator section CMP through the sampling switch matrix SHS of the switch matrix section SMX. To the inverting (−) input terminal of the comparator C1 is constantly supplied a reference voltage $V_r/2$ which is produced by the reference voltage generator section VRG. At a time slot T3 the comparator C1 compares the sample voltage SD1 with the reference voltage $V_r/2$. As mentioned earlier, since the sampled voltage SD1 is assumed to be slightly higher than the reference voltage $221V_r/256$, the comparator C1 produces an output signal of logic 1 or high level.

The logic 1 output signal of the comparator C1 is, as mentioned earlier, transferred to the first input terminal of the shift register SR where it is delayed eight time slots to become an output digital signal D7 of the most significant bit or highest order bit. This output signal is also supplied to the control section CTL to produce a selection control signal for selectively activating the comparator C2A and at the same time start precharging the reference voltages $7V_r/8$ and $5V_r/8$ for the comparators C3A and C3B that are currently deactivated. That is, with the comparison result of the comparator C1 having become a logic 1, it is anticipated that the reference voltage value that should be applied to the comparators C3A-C3C is either $7V_r/8$ or $5V_r/8$. And the final decision on the selection between the two values is made when the comparison result of the comparator C2A becomes available.

The inverting (−) input terminal of the comparator C2A constantly receives the reference voltage $3V_r/4$, as described above. Then at the next time slot T4 the comparator C2A compares the sampled voltage SD1 with the reference voltage $3V_r/4$. At this time, the comparator C2B is deactivated but precharges the inverting (−) input terminal by the reference voltage $Vr/4$ in preparation for the comparison operation of the next sampled voltage. As mentioned above, the sampled voltage SD1 is assumed to be slightly higher than the reference voltage $221V_r/256$. Therefore, the output signal of the comparator C2A becomes high or logic 1.

The logic 1 output signal of the comparator C2A is transferred to the second input terminal of the shift register SR where it is delayed seven time slots to become an output digital signal D6 of the second highest bit. This output signal is also supplied to the control section CTL to generate a selection control signal for selectively activating the comparator C3A and at the same time initiate precharging the reference voltages $15V_r/16$ and $13V_r/16$ for the comparators C4B and C4C that are currently deactivated. That is, with the comparison result of the comparator C2A having become a logic 1, it is anticipated that the reference voltage value that should be applied to the comparators C4A-C4C is either $15V_r/16$ or $13V_r/16$. The final decision on the selection between the two values is made when the comparison result of the comparator C3A becomes available.

The inverting (−) input terminal of the comparator C3A is supplied with the reference voltage $7V_r/8$ through the reference voltage switch matrix VRS. At the next time slot T5, the comparator C3A compares the sampled voltage SD1 with the reference voltage $7V_r/8$. At the same time, comparators C3B and C3C set two reference voltages for the next sampled voltage SD2. That is, reference voltages are precharged to the inverting input terminals of the comparators C3B and C3C. Since the sampled voltage SD1 is slightly higher than the reference voltage $221V_r/256$ as mentioned earlier, the output signal of the comparator C3A goes low or becomes logic 0.

Likewise, for two of the three comparators in each set C4A-C4C to C8A-C8C, the reference voltages are precharged which are determined according to the comparison result of a comparator that corresponds to an output digital signal two bits higher. And one of these comparators is selected and activated according to the comparison result of a comparator corresponding to an output digital signal one bit higher. Hence, as shown by solid line in FIG. 2, comparison between the sampled voltage SD1 and the reference voltages $13V_r/16$, $27V_r/32$, $55V_r/64$, $111V_r/128$ and $223V_r/256$ is successively performed by the comparators C4C, C5A, C6A, C7A and C8C. This is also shown in FIG. 3. As a result, at a time slot T11, 8-bit output digital signals D7-D0 "11011101" are parallelly output from the A/D convertor.

The above conversion processing is carried out without interruption one time slot at a time, and the output digital signals D7-D0 change with the time slot as a period. That is, the A/D convertor of this embodiment works as a high-speed A/D convertor that converts the input analog signal $V_{in}$ into 8-bit output digital signals D7-D0 with the time slot as its apparent period. During this process, the conversion speed of the A/D convertor is restricted by the precharge operation or the compare operation of the comparators C1-C8, whichever is slower. But when compared with the conventional pipeline type A/D convertor whose conversion speed is limited by the sum of the times required for the precharge and compare operations, the conversion speed of this embodiment is about two times faster. As a result, the high-speed performance of the video CODEC incorporating the A/D convertor is improved, which in turn enhances the overall performance of the wide-band ISDN including the video CODEC. Further, the A/D convertor of this embodiment, as mentioned above, has various components formed basically of CMOS circuits, so that the required layout area of the convertor can be reduced, minimizing the amount of operating current required. All this reduces the power consumption of the video CODEC including the A/D convertor while at the same time reducing the chip area and achieving cost reduction.

Application of this invention to the A/D convertor incorporated in the video CODEC for the wide-band ISDN produces the following advantages.

(1) In the A/D convertor incorporated in the video CODEC for the wide-band ISDN, one comparator is provided for the most significant bit of the output digital signal, two for the second highest bit, and three each for the third and lower bits. When the compare operation is performed by one of the three comparators provided for the third or lower bit, the remaining two comparators precharge two reference voltages which are specified by the comparison result of a comparator for an output digital signal two bits higher. This method minimizes an increase in the amount of hardware in the A/D convertor and makes it possible to reduce the sampling period close to the duration of compare operation or precharge operation of the comparator.

(2) In the above advantage (1), the components of the A/D convertor are formed basically of the CMOS circuits to reduce the required layout area and the operating current of the A/D convertor.

(3) Because of the above (1) and (2), it is possible to reduce the cost and power consumption of the video CODEC incorporating the A/D convertor and at the same time enhance the high-speed performance.

(4) From the above (1) to (3), it is possible to enhance the overall performance of the wide-band ISDN including the video CODEC.

The invention has been described by way of example embodiments and it should be noted that the invention is not limited to the embodiments alone but various changes may be made without departing the scope of the invention. For instance, in FIG. 1, if the settling time of each sample-and-hold circuit is within one time slot, the number of sample-and-hold circuits making up the sample-and-hold section SH can be reduced to nine. When a further increase in the conversion speed of the A/D convertor is needed, five comparators may be used for each of the fourth and lower bits of the output digital signal. In this case, one comparator is provided for the most significant bit of the output digital signal, two for the second highest bit and four for the third highest bit, and these comparators are continuously supplied with reference voltages $V_r/2$, $3V_r/4$, $V_r/4$, $7V_r/8$, $5V_r/8$, $3V_r/8$ and $V_r/8$. When the compare operation is performed by one of the five comparators provided for the fourth or lower bit, the remaining four comparators need to precharge four reference voltages that are specified by the comparison result of a comparator three bit higher. It is not necessary for the sampling switch matrix SHS and the reference voltage switch matrix VRS to be combined into one switch matrix section SMX. The shift register SR may be replaced with other delaying means provided that the delaying means shifts the output signals of the comparators C1–C8C a specified number of time slots at a time in synchronism with the basic clock signals. The number of bits of the output digital signal in the A/D convertor may be four or more than eight. Further, the sample-and-hold section, operational amplifier circuits, reference voltage generator section, switch matrix section, voltage comparator section, output switch section and comparators shown in FIGS. 4 to 9 may be formed basically of bipolar CMOS circuits or of CMOS circuits and bipolar CMOS circuits combined. There can be many variations to the circuit configuration, supply voltage and MOSFET configuration.

Although the above description concerns the A/D convertor which is incorporated in the video CODEC for the wide-band ISDN—the field in which this invention has originated, the invention is not limited to this application alone but can be applied to a stand-alone A/D convertor or to similar A/D convertors included in other kinds of digital systems or measuring equipment. This invention can at least be applied to A/D convertors required of high-speed performance and to digital equipment incorporating such A/D convertors.

Representative advantages of this invention may be briefly summarized as follows. In the A/D convertor included in the video CODEC for wide-band ISDN, one comparator is provided for the most significant bit of the output digital signal, two for the second highest bit, and three each for the third and lower-order bits. When the compare operation is performed by one of the three comparators provided for the third or lower bit, the remaining two comparators precharge two reference voltages which are specified by the comparison result of a comparator for an output digital signal two bits higher. Components of the A/D convertor are formed basically of CMOS or bipolar CMOS circuits. This minimizes an increase in the amount of hardware of the A/D convertor and reduces the required layout area and power consumption while allowing the sampling period to be reduced close to the time of compare operation or precharge operation of the comparators. This in turn reduces the cost and power consumption of the video CODEC incorporating the A/D convertor, enhancing the high-speed performance of the CODEC and therefore the overall performance of the wide-band ISDN which includes the video CODEC.

Figure 10:
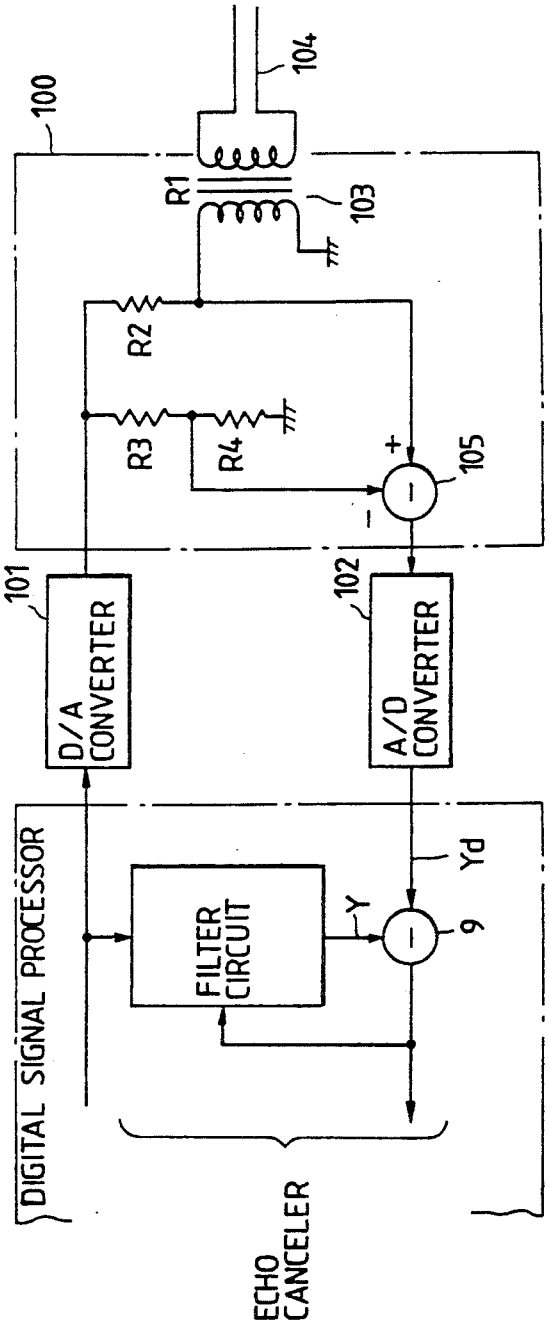
FIG. 10 is a circuitry showing one example of the A/D convertor of this invention as applied to the ISDN transmission equipment.

FIG. 10 shows one example system of ISDN transmission equipment to which the A/D convertor of this invention is applied. The ISDN transmission equipment is connected through a balancing network 100 to a telephone circuit. A digital-to-analog (D/A) convertor 101 converts the transmission data into analog signals at two or more levels and feeds them to the balancing network 100. The analog signal from the balancing network 100 is transferred to an analog-to-digital (A/D) convertor 102 where it is converted into digital signal and taken into rear stages of the transmission equipment. The balancing network 100 removes the voltage components of the transmitted analog signals from voltage components that are transferred from the telephone circuit 104 through a transformer 103. In the balancing network 100 series resistors R3, R4 are provided whose resistance ratio is equal to that between the impedance R1 of the transformer 103 and a resistor R2. The divided voltage from the former is subtracted from the divided voltage of the latter by a subtractor 105.

A plurality of digital signal processors interconnected through telephone circuits each perform the sending and receiving operations simultaneously. That is, the digital signal processor shown in FIG. 10, when it is feeding the transmission signal to the telephone circuit 104 through the D/A convertor 101 and the transformer 103, also receives transmission signals from other digital processors through the telephone circuit 104, transformer 103 and A/D convertor 102. To prevent a part of the signal transmitted from the D/A convertor 101 from being fed back as noise to the A/D convertor 102 through the transformer 103, the balancing network 100 including the subtractor 105 is provided.

In accordance with the Standard requirement that telephone circuits have a constant impedance of 135 Ω at any location, this balancing network 100 assumes that the impedance of the transformer 103 is constant, in taking measures for preventing the feedback of the transmission signal. In reality, however, there are variations in impedance and the conditions of telephone circuits will change over time. Furthermore, it is impossible to tell in what condition the telephone circuit to which the balancing network is to be connected will be. Under these circumstances, an echo canceler is used to reliably remove the undesired components or echo components that circulate from the sending side to the receiving side.

Such an echo canceler and digital signal processor may use circuits shown in the U.S. patent application Ser. No. 697,669 by H. Hara, et al.

We claim:

1. An A/D convertor comprising:

at least three comparators provided for each lower order bit of an output digital signal, said output digital signal consisting of a plurality of bits;

means for producing a plurality of reference voltages; and means for setting a specified reference voltage for each of the comparators;

wherein when one of the three comparators is performing a compare operation on an input analog signal, the means for setting performs said setting of said specified reference voltage in response to outputs from remaining comparators.

2. An A/D convertor according to claim 1, wherein one of said reference voltages is selectively specified as said specified reference voltage according to a result of a comparison by a comparator that corresponds to a bit of said output digital signal at least two bits higher than a bit of said output digital signal that corresponds to a comparator which makes use of said specified reference voltage.

3. An A/D convertor according to claim 2, wherein one comparator is provided corresponding to the most significant bit of the output digital signal, two comparators are provided corresponding to the second most significant bit of the output digital signal, and said at least three comparators are provided corresponding to each of the third most significant and lower order bits of the output digital signal.

4. An A/D convertor according to claim 3, further comprising:

a plurality of sample-and-hold circuits for receiving input analog signals;

an input switch section for selectively transferring to a specified comparator a sampled voltage held by a specified sample-and-hold circuit and said specified reference voltage;

an output switch section of selectively transferring an output signal of the specified comparator; and a shift register for receiving the output signal of the output switch section.

5. A/D convertor according to claim 4, wherein said input switch section is a switch matrix in which unit switch circuits are arranged in matrix.

6. A transmission system comprising:

a telephone circuit for transmitting analog signals;

a digital signal processor for processing digital signals; and an A/D convertor having its input terminal coupled to said telephone circuit and its output terminal coupled to said digital signal processor, said A/D convertor comprising:

at least three comparators provided for each lower order bit of an output digital signal, said output digital signal consisting of a plurality of bits;

means for producing a plurality of reference voltage; and means for setting a specified reference voltage for each of the comparators;

wherein when one of the three comparators is performing a compare operation on an input analog signal, the means for setting performs said setting of said specified reference voltage in response to outputs from remaining comparators.

7. An A/D convertor according to claim 6, wherein one of said reference voltages is selective specified as said specified reference voltage according to a result of a comparison by a comparator that corresponds to a bit of said output digital signal at least two bits higher than a bit of said output digital signal that corresponds to a comparator which makes use of said specified reference voltage.

8. An A/D convertor according to claim 7, wherein one comparator is provided corresponding to the most significant bit of the output digital signal, two comparators are provided corresponding to the second most significant bit of the output digital signal, and said at least three comparators are provided corresponding to each of the third most significant and lower-order bits of the output digital signal.

9. An A/D convertor according to claim 8, further comprising:

a plurality of sample-and-hold circuits for receiving in put analog signals;

an input switch section for selectively transferring to a specified comparator a sampled voltage held by a specified sample-and-hold circuit and said specified reference voltage;

an output switch section of selectively transferring an output signal of the specified comparator; and a shift register for receiving the output signal of the output switch section.

10. A/D convertor according to claim 9, wherein said input switch section is a switch matrix in which unit switch circuits are arranged in matrix.

* * * * *